United States Patent [19]
Woith et al.

[11] Patent Number: 5,339,027
[45] Date of Patent: Aug. 16, 1994

[54] RIGID-FLEX CIRCUITS WITH RAISED FEATURES AS IC TEST PROBES

[75] Inventors: Blake F. Woith, Orange; William R. Crumly, Anaheim; Jacques F. Linder, Rancho Palos Verdes, all of Calif.

[73] Assignee: Hughes Aircraft Company, Los Angeles, Calif.

[21] Appl. No.: 22,253

[22] Filed: Feb. 24, 1993

Related U.S. Application Data

[62] Division of Ser. No. 752,422, Aug. 30, 1991, Pat. No. 5,264,787.

[51] Int. Cl.⁵ .............................................. G01R 1/073
[52] U.S. Cl. .................................... 324/754; 324/158.1
[58] Field of Search ................ 324/158 P, 158 F, 72.5

[56] References Cited

U.S. PATENT DOCUMENTS

| | | | |
|---|---|---|---|
| 4,065,717 | 12/1977 | Kattner et al. | 324/158 P |
| 4,972,143 | 11/1990 | Kamensky et al. | 324/158 P |
| 4,994,735 | 2/1991 | Leedy | 324/158 P |

FOREIGN PATENT DOCUMENTS

| | | |
|---|---|---|
| 0259163 | 3/1988 | European Pat. Off. |
| 0294939 | 12/1988 | European Pat. Off. |
| 2617290 | 12/1988 | France |

*Primary Examiner*—Ernest F. Karlsen
*Attorney, Agent, or Firm*—Elizabeth E. Leitereg; Terje Gudmestad; W. K. Denson-Low

[57] ABSTRACT

A circuit testing fixture is provided in which a flexible membrane (17) is provided with raised features (25) on one side arranged in the pattern of contacts (65) on a device (63) to be tested and circuit means (26) connected to a probe card (12). On the opposite side of the membrane is a support form (58), (66), (70) that is clamped in position so that it acts as a pressure pad to planar bottom edge which may provide ridges (61) in back deflect the membrane outwardly. The support form has a of the raised features (25) on the membrane (17) or recesses (68) at that location. The support form also may have a flat bottom surface (71) and may be of soft compliant material or of rigid material.

7 Claims, 3 Drawing Sheets

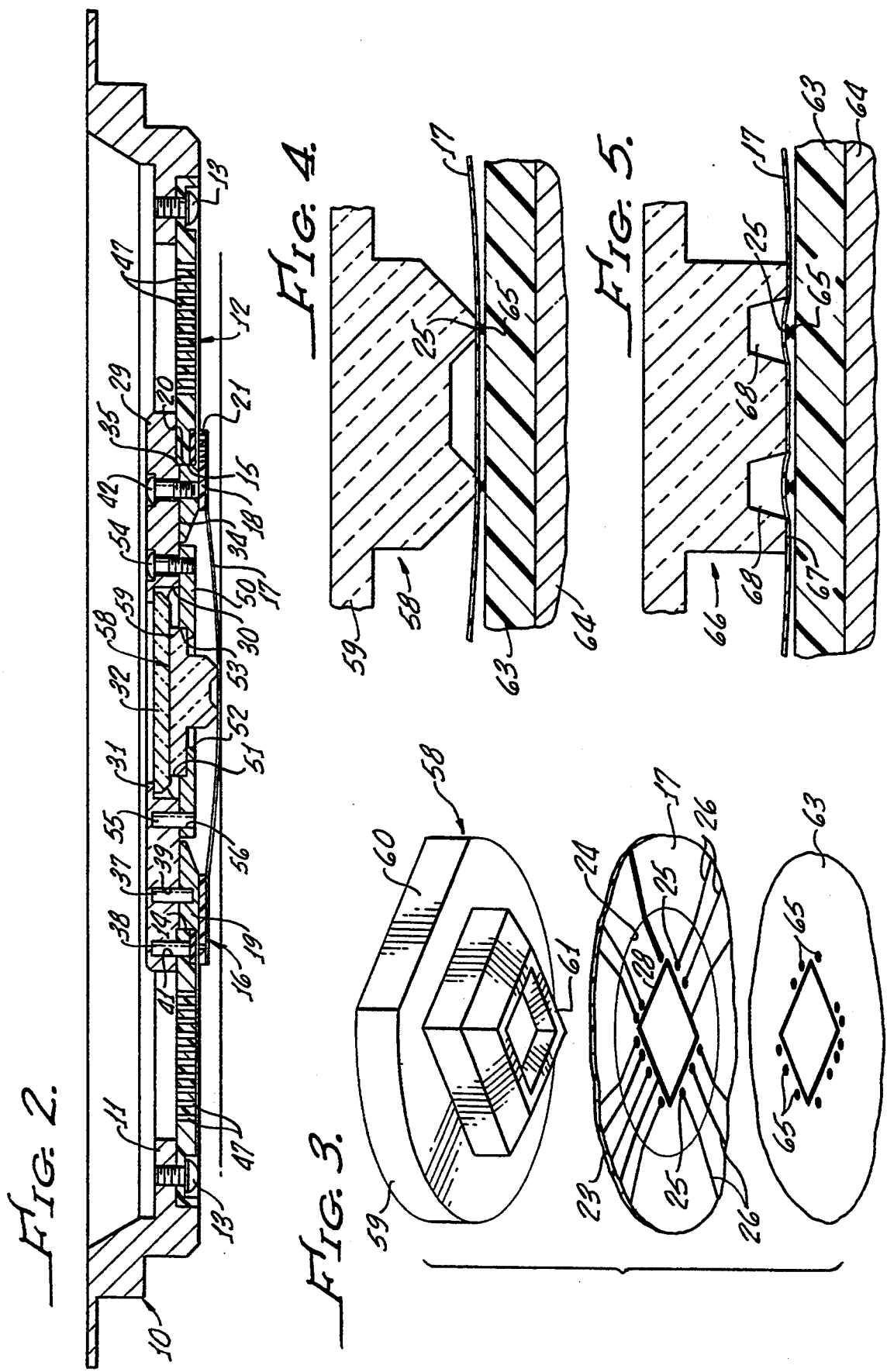

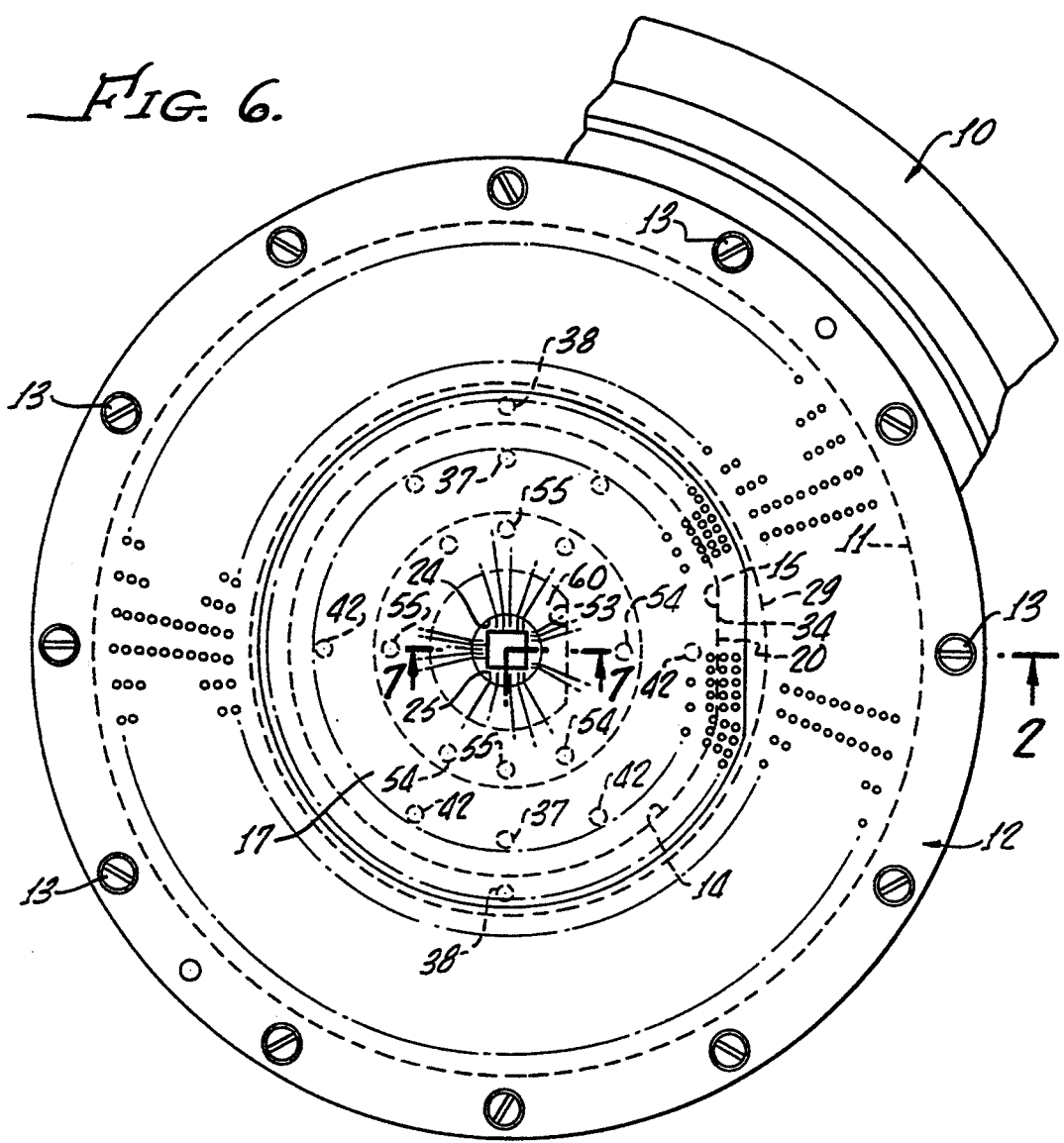
FIG. 6.
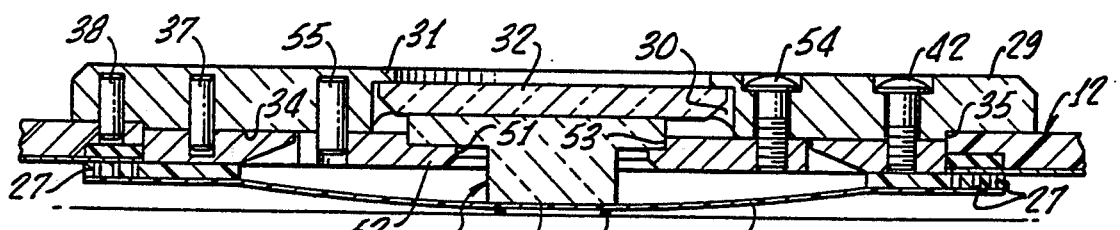
FIG. 7.
FIG. 9.

RIGID-FLEX CIRCUITS WITH RAISED FEATURES AS IC TEST PROBES

This is a division of application Ser. No. 07/752,422 filed Aug. 30, 1991, now U.S. Pat. No. 5,264,787.

BACKGROUND OF THE INVENTION

1. Field of the Invention

This invention relates to the testing of integrated circuits or other items having a pattern of contacts thereon.

2. Description of Related Art

Integrated circuits or chips are manufactured with large numbers of identical circuits on a single wafer which ultimately are separately cut from the wafer for use. It is necessary to test each circuit individually to determine whether or not it functions as intended before separating it from the wafer.

Conventional testing employs a probe card which is provided with a large number of small tungsten blades or needles that are mechanically and electrically connected to a circuit board and act as contacts. Electrical leads extend from the contacts to the outer edge of the board for connecting the probe card to test circuitry. In use, the blades or needles are moved into engagement with the pads of an integrated circuit. This provides an electrical connection so that signals can be read to determine the integrity of the circuit on the chip.

The needles or blades must all fall in the same plane in order to assure that each one makes electrical contact with a pad of the integrated circuit. This is accomplished by bending the blades or needles after they are mounted on the probe card, which is laborious, time consuming and expensive. Even after such adjustment the blades or needles tend to creep back toward their original positions so that their adjusted locations are lost. This loss of adjustment also comes about from the pressure of the needles against the chips, aggravated by the scrubbing action used to assure penetration of any oxide coating. As a result, constant maintenance is necessary or the probe cards will not perform their intended function. Even when in proper adjustment, the needles cannot compensate for significant differences in the heights of the contact pads on the integrated circuit chips being tested. The needles also may apply excessive forces against the chips so as to damage the chips. The close spacing necessary for testing some chips cannot be achieved with conventional needle contacts.

An improved testing arrangement is disclosed in copending application Ser. No. 606,676, filed Oct. 31, 1990, by John Pasiencznik, Jr., now U.S. Pat. No. 5,148,103 for METHOD AND APPARATUS FOR TESTING INTEGRATED CIRCUITS assigned to the same assignee as that of this application. This prior application is incorporated herein by reference as though fully set forth. In this prior arrangement, a flexible membrane is provided with raised features on one side which connect through circuit traces to a probe card that, in turn, is connected into the test circuit. Air pressure is used to deflect the membrane as the contacts of the membrane are pressed against the pads of an integrated circuit to provide an electrical connection. There is room for improvement, however, in assuring that adequate pressure exists between the contacts on the membrane and the pads on the integrated circuit chip to assure a good electrical connection, while at the same time avoiding undesirable contact between remaining portions of the membrane and the chip.

The amount of pressure on the membrane in the earlier design is limited by its physical characteristics which in turn limit its ability to engage contacts on the chip which are not in the same plane. Advancement of the chip toward the membrane merely will deflect the membrane inwardly rather than causing all of the contacts to make engagement in some instances. Excessive drape of the membrane around the contacts may result. The membrane will be deflected to such an extent that it undesirably engages the chip around the contact rather than engaging only at the contacts.

SUMMARY OF THE INVENTION

The present invention provides an improved arrangement for testing integrated circuit chips or the like which utilizes a combination of a membrane having contacts on one side for engagement with the pads of an integrated circuit chip, together with a support form on the other side of the membrane to direct the force applied by the membrane.

In one version, the support form is a pliable soft pad of a transparent elastomer that is mechanically clamped so that it causes the membrane to be distended for applying a force between the membrane contacts and the pads of the integrated circuit chip. The support form may have a pattern of ridges, all in the same plane, on the surface that engages the membrane. The ridges are positioned opposite from the contacts so that they can concentrate the force applied by the contacts. The item to be tested is positioned below the membrane on a work table which can move horizontally as well as vertically relative to the membrane. The operator can sight through the transparent support pad, as well as through a transparent window in the membrane, to align the contacts of the membrane with pads on the integrated circuit chip.

As a result, an effective electrical connection can be accomplished very easily with assurance that the contacts all will be brought into engagement with the chip. If there is some variation in the height of the pads on the chip, the pliable support form will compensate for this allowing some contacts to extend farther than others to make the necessary engagement. This is accomplished without the use of excessive localized force so that damage to the chip is avoided. By concentrating the force on the membrane at the location of the raised features, the membrane will not drape around the contacts to make undesirable engagement with the chip at locations other than the contacts. The raised features on the membrane may be as closely spaced as necessary to correspond to the pattern of contact pads on any integrated circuit chip.

In another embodiment the support form has ridges that straddle the locations of the contacts so that the contacts are forced against the pads on the chip from either side. Again, compensation is possible for variation in the height of the pads on the chip.

In a further embodiment the support pad has a flat bottom surface and may be of a rigid material such as glass.

BRIEF DESCRIPTION OF THE DRAWING

FIG. 2 is a transverse sectional view taken along line 2—2 of FIG. 6;

FIG. 3 is an enlarged fragmentary exploded perspective view showing the support form, membrane and an integrated circuit chip to be tested;

FIG. 4 is an enlarged fragmentary sectional view illustrating the deflection of the membrane by the support form;

FIG. 5 is a view similar to FIG. 4 including a modified support form;

FIG. 6 is a bottom plan view of the circuit testing device;

FIG. 7 is an enlarged fragmentary sectional view of the membrane assembly;

FIG. 9 is a transverse sectional view illustrating the device with a modified support form.

DESCRIPTION OF THE PREFERRED EMBODIMENTS

Figure 1:
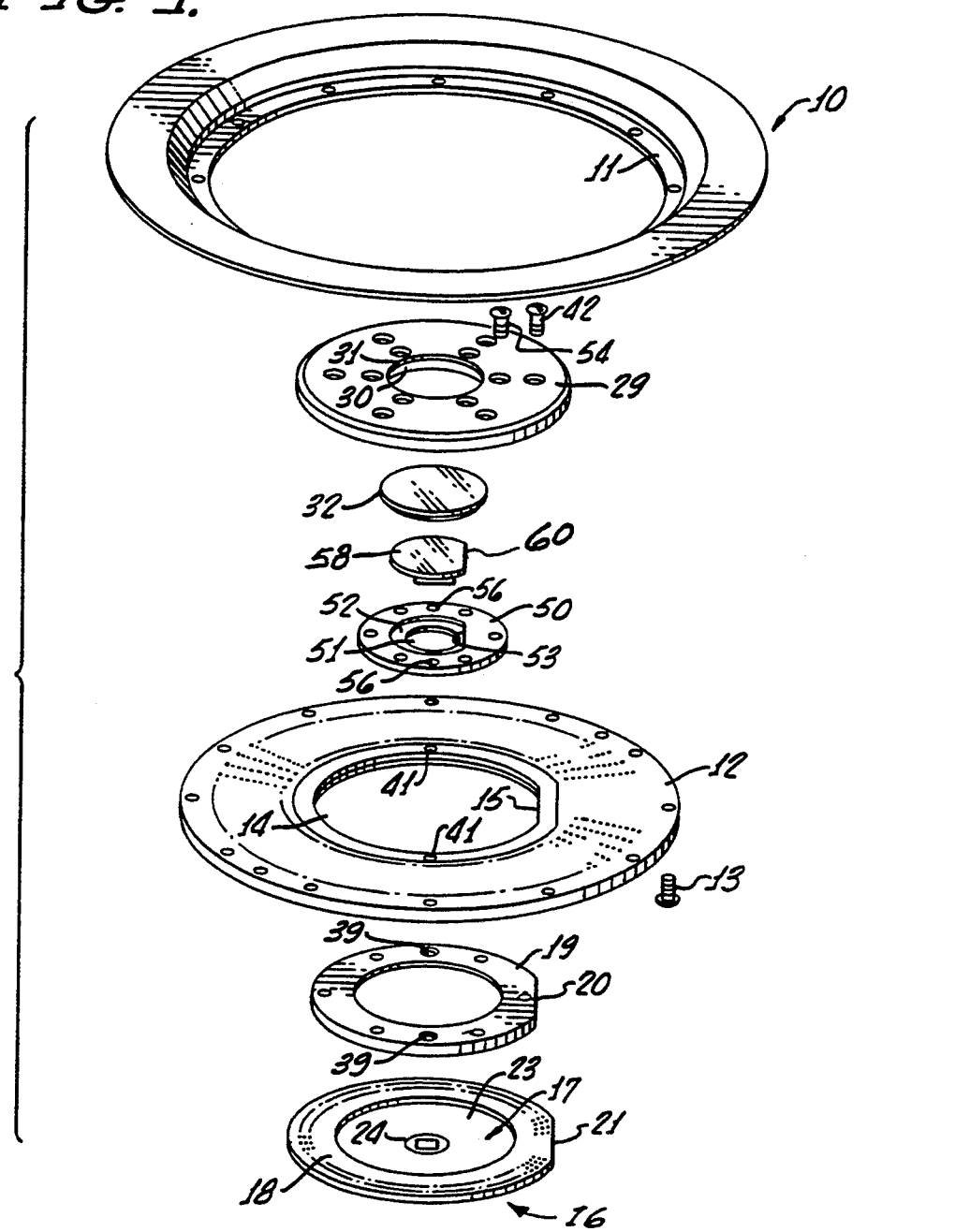
FIG. 1 is an exploded perspective view of the circuit testing arrangement of this invention.
Figure 8:
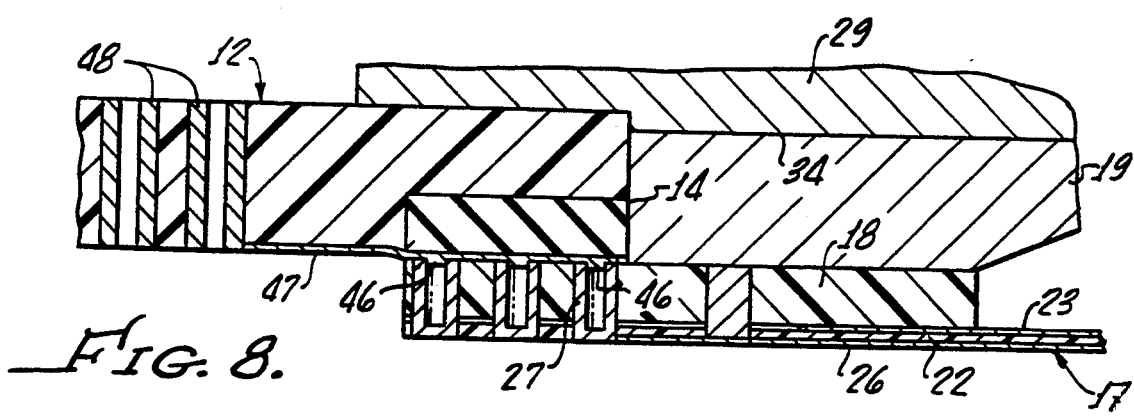
FIG. 8 is an enlarged fragmentary view illustrating the zone where the membrane assembly engages the probe card.

The test fixture of this invention includes a rigid annular frame 10 having a flange 11 around its inner peripheral edge to which is connected a probe card 12 by means of screws 13. The probe card 12 is a form of printed circuit board that includes a rigid dielectric member which carries circuit traces and contact elements. An opening 14 in the probe card 12 is circular except for a flat 15 to assist in aligning the other components of the fixture.

Positioned beneath the probe card is a membrane assembly 16 which consists of a flexible membrane 17 around the periphery of which is a rigid ring 18 of dielectric material. Bonded to one side of the ring 18 is a thicker annular member 19 of dielectric material which leaves the central portion of the membrane exposed. A flat 20 is provided on the otherwise circular periphery of the annular member 19 just as a flat 21 is located on the periphery of the diaphragm assembly 16. These flats are used for alignment purposes. The flat 21 is radially farther from the center of the assembled unit than is the flat 20.

The membrane 17 is of laminated construction including a layer of transparent polymide 22 on one side of which (the upper side, as shown) is a layer of copper 23 which acts as a grounding plane. A central opening 24 in the copper layer 23 exposes the polymide layer. On the opposite side of the polymide layer 22 at its central portion are raised features 25 which are gold plated. These contacts are in the exact pattern of contact pads on an integrated circuit chip to be tested and can be seen from above through the opening 24 in the layer 23. Conductors 26 extend outwardly in the radial direction from the raised features 25. The conductors 26 connect to plated through holes 27 around the periphery of the membrane 17 at the location of the rigid disk 18. A grounding bus 28 also is included within the gold dots 25.

On the upper side of the probe card 12, as the device is illustrated, is a disk 29, which may be made of aluminum, having a central opening 30 into which projects a narrow flange 31. A glass window 32 is bonded to the member 29 at the opening 30, butting against the underside of the flange 31. The bottom surface of the disk 29 is recessed around its outer edge to provide a central projection 34 which has a periphery generally complementary to the opening 14 in the probe card 12. The projecting portion 34 extends down into the opening 14 in the probe card, and includes a flat 35 which indexes the disk 29 rotationally with the probe card.

The annular member 19 extends into the opening 14 from the lower side with its flat 20 also indexing the membrane assembly 16 rotationally with the probe card 12.

Precise alignment of the disk 29 and membrane 17 is accomplished by two pairs of diametrically opposite pins 37 and 38 which project downwardly from the disk 29. The inner pair of pins 37 enters openings 39 in the annular member 19. The outer pair of pins 38 extends into diametrically opposite openings 41 in the probe card 12. Therefore, the membrane assembly 16 is aligned with the disk 29 and the latter member is aligned with the probe card 12, resulting in alignment between the membrane and the probe card. Screws 42 extend through in the disk 29 and into the annular member 19 to hold the components together.

In the assembled relationship, the contacts 27 of the membrane assembly bear against contacts 46 around the inner periphery of the probe card 12. The latter contacts connect through circuit traces 47 to contacts 48 outwardly on the probe card, which in turn mate with conductive elements in the testing instrument, not shown.

Connected to the underside of the disk 29 is a retainer 50 in the form of a flat disk having a circular central opening 51, recessed at its upper end to provide an inner peripheral flange 52 and a flat 53. Screws 54 connect the retainer 50 to the disk 29, while alignment pins 55 on the disk 29 extend into openings 56 in the retainer to position the retainer relative to the disk.

A support form 58 is positioned above the membrane 17 and held by the retainer 50. The support form 58 is a pad of transparent material, such as a clear silicone rubber, and is soft, having a shore A hardness in the range of 40 to 60. At the upper end of the form 58 is a flange 59 which fits complementarily within the opening 51 in the retainer 50 above the flange 52. The flange 59 of the support form is held between the glass window 32 and the flange 52, indexed rotationally by a flat 60 on the support form that is positioned against the flat 53 of the opening 51.

Beneath the flange 59, the support form 58 is relatively thick and tapers downwardly to an annular rectangular bottom edge 61 that is entirely within a horizontal plane, as the device is illustrated. The edge 61 provides a ridge that has the same shape as the pattern of the raised features 25 on the bottom of the membrane 17. The support form 58 is rotationally aligned by the retainer 50 so that its bottom edge 61 is opposite from the raised features 25. With the support form 58 clamped in position by the retainer 50 the bottom edge of the form deflects the membrane 17 outwardly beneath the probe card 12.

In use of the device of this invention, an integrated circuit chip 63 is positioned on a horizontal table 64 which has provision for movement in the X-Y plane and also Z axis movement. The operator visually sights, with the aid of a microscope, through the glass window 32, the support form 58 and the opening 24 and manipulates the table 64 so that the contact pads 25 on the membrane are aligned with the contacts 65 on the integrated circuit chip 63. The table 64 is moved toward the test fixture so that the contacts 25 of the membrane engage the contacts 65 of the integrated circuit chip and form electrical connections therewith. This is readily accomplished with the membrane 17 being distended in the direction of the table 64 by the support form 58. Sufficient relative advancement of the table 64 is accomplished to cause the mating contacts to press firmly against each other.

The support form not only deflects the membrane 17 outwardly to engage the integrated circuit chip, but also provides a means for applying uniform pressure against all of the contacts 25 to assure a good electrical connection with the chip. By being soft and compliant, the support form 58 can allow for limited over-travel in certain locations. This is important in the event that all of the contacts 65 on the integrated circuit chip 63 are not entirely within the same plane. The support form 58 will push the membrane 17 into locations where the contacts on the chip may be recessed to accomplish an electrical connection. Adequate force may be applied to achieve the electrical connection without damaging the chip. The pattern of the bottom edge 61 of the support form 58, following that of the contacts 25 on the membrane and of the contacts 65 on the integrated circuit chip, concentrates the force of the membrane against the contacts which are to be brought into engagement with each other. By localizing the force on the membrane 17, the drape of the flexible circuit around the IC chip is minimized. In other words, there is not much tendency for the membrane to be deflected past the contact pads on the chip to engage the chip at other locations.

In the embodiment of FIG. 5, the support form 66 has a flat bottom edge 67 with recesses 68 above the contacts 25 of the membrane 17. As a result, the membrane is pulled slightly down around the contacts of the integrated circuit chip, again assuring intimate contact between the contacts 25 and those of the integrated circuit chip. This engagement between the mating contact will occur even if the contacts of the integrated circuit chip are not entirely within a single plane. Excessive drape of the membrane 17 is avoided.

In the embodiment of FIG. 9, the support form 70 has a planar bottom surface 71 without ridges or recesses. In this instance the support form 70 also is rigid and may be made of glass or a transparent plastic. The support form 70 applies a uniform force against the contacts while avoiding drape of the membrane The support forms 58 and 66 also may be made of rigid material for certain installations. Also, the size of the support forms of compliant material may be varied so as to provide a relatively thin pad behind the membrane. The support form will nevertheless be confined along its upper surface, such as by the glass window 32.

The foregoing detailed description is to be clearly understood as given by way of illustration and example only, the spirit and scope of this invention being limited solely by the appended claims.

What is claimed is:

1. A device for testing an electrical circuit element having contacts thereon in a predetermined pattern comprising
   a flexible membrane,
   a plurality of contacts on one side of said membrane, said contacts being in a predetermined pattern corresponding in position to the pattern of contacts on a device to be tested,
   circuit means on said membrane extending away from said contacts for connection to a test circuit,
   means for supporting said diaphragm outwardly of said contacts,
   a support form engaging the opposing side of said membrane,
   means for positioning said support form so that a surface of said form engages said membrane and deflects said membrane outwardly, whereby said contacts on said membrane can be pressed against contacts of a device to be tested,
   said surface of said support form having recess means therein opposite from and following the pattern of said contacts on said membrane and providing portions of said surface on either side of said recess means, whereby said portions of said surface on either side of said recess means can hold said contacts on said membrane for engagement with contacts of a device to be tested.

2. A device as recited in claim 1 in which said support form is transparent and said membrane is transparent adjacent said contacts thereon for permitting visual alignment of said contacts on said membrane with contacts on a device to be tested.

3. A device as recited in claim 1 in which said support form is a relatively soft and compliant pad.

4. A device as recited in claim 3 in which said support form has a hardness ranging from about 40 to 60 on the Shore A scale.

5. A device as recited in claim 3 in which said support form is made of silicone rubber.

6. A device as recited in claim 1 in which said support for is rigid.

7. A device as recited in claim 1 in which said surface of said support form is planar.

* * * * *